United States Patent
Johnston et al.

(10) Patent No.: US 6,877,123 B2
(45) Date of Patent: Apr. 5, 2005

(54) SCAN CLOCK CIRCUIT AND METHOD THEREFOR

(75) Inventors: Thomas K. Johnston, Austin, TX (US); Frank Frederick, Austin, TX (US)

(73) Assignee: Freescale Semiconductors, Inc., Austin, TX (US)

( * ) Notice: Subject to any disclaimer, the term of this patent is extended or adjusted under 35 U.S.C. 154(b) by 460 days.

(21) Appl. No.: 10/025,291

(22) Filed: Dec. 19, 2001

(65) Prior Publication Data

US 2003/0115524 A1 Jun. 19, 2003

(51) Int. Cl.$^7$ .............................................. G01R 31/28
(52) U.S. Cl. ....................................................... 714/731
(58) Field of Search ................................ 714/724, 726, 714/727, 729, 731, 733, 734, 744; 713/400

(56) References Cited

U.S. PATENT DOCUMENTS

| | | | |
|---|---|---|---|
| 5,018,144 A | 5/1991 | Corr et al. | |
| 5,181,191 A | 1/1993 | Farwell | |
| 5,524,114 A | * 6/1996 | Peng ........................... | 714/724 |
| 5,617,426 A | 4/1997 | Koenemann et al. | |
| 5,774,474 A | 6/1998 | Narayanan et al. | |
| 6,014,763 A | 1/2000 | Dhong et al. | |
| 6,023,778 A | 2/2000 | Li | |
| 6,055,658 A | 4/2000 | Jaber et al. | |
| 6,115,827 A | 9/2000 | Nadeau-Dostie et al. | |
| 6,148,425 A | 11/2000 | Bhawmik et al. | |

OTHER PUBLICATIONS

Copy co–pending Application w/Drawings; SC11001TH, U.S. Appl. No. 09/513,867, filed Feb. 28, 2000; entitled "Method and Apparatus For Testing An Integrated Circuit".

* cited by examiner

Primary Examiner—Albert Decady
Assistant Examiner—John J. Tabone, Jr.
(74) Attorney, Agent, or Firm—Joanna G. Chiu; Robert L. King

(57) ABSTRACT

Embodiments of the present invention relate generally to scan clock waveform generation. One embodiment utilizes global and local circular shift registers to provide a series of shift/capture pulses at a manageable frequency for the tester and launch pulses that are phase shifted in order to provide for at-speed testing. Therefore, scan test patterns may be shifted in or out of state elements at lower frequencies as compared to the normal operating frequency of the integrated circuit being tested, while still allowing for at-speed testing. An alternate embodiment utilizes a circular shift register in combination with static storage devices and waveform generators to provide the shift/capture pulses and launch pulses. Embodiments of the present invention also allow for clock inversion where the clock and clock bar signals are dependent during normal mode and independent during scan test mode.

22 Claims, 6 Drawing Sheets

US 6,877,123 B2

SCAN CLOCK CIRCUIT AND METHOD THEREFOR

RELATED APPLICATION

This is related to U.S. patent application Ser. No. 09/513,867 filed on Feb. 28, 2000, and entitled "Method and Apparatus for Testing an Integrated Circuit" and is assigned to the current assignee hereof.

FIELD OF THE INVENTION

The present invention relates to the testing of integrated circuits (IC), and more specifically, to generating scan clock waveforms for testing the ICs.

RELATED ART

After an integrated circuit is manufactured, it is put through a series of tests. One of these tests is a scan-based structural test. When performing scan-based structural testing, several problems must be addressed.

One problem relates to the capabilities of the automatic test equipment (ATE), or IC tester. Applying at-speed scan vectors requires test equipment that has the ability to apply clock cycles at the speed of the fastest clock specified by the IC being tested. However, many testers cannot apply clock cycles at such speeds. Also, a tester may not be able to provide the clock edge-rates (the rate at which the clock signal transitions from low to high, or from high to low) required by some devices. As the speed and precision of testers increases, so does its cost. Since the cost of the tester significantly affects the cost of a tested device, less expensive testers are desired.

Another problem relates to the pads on the IC. The pads may be a limitation that negates the capabilities of the tester. For example, pads that can handle the speed of the clock from the tester may not be available. Also, any signal passing through the pad may be degraded by the pad.

Another problem relates to the power consumed by the IC during the testing process. When performing scan testing, there is a possibility of a high toggle rate, and therefore, high power consumption. To reduce the power consumed by the integrated circuit during testing, it is desirable to reduce the toggle rate, where the toggle rate includes the number of transitions for the frequency of the data.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
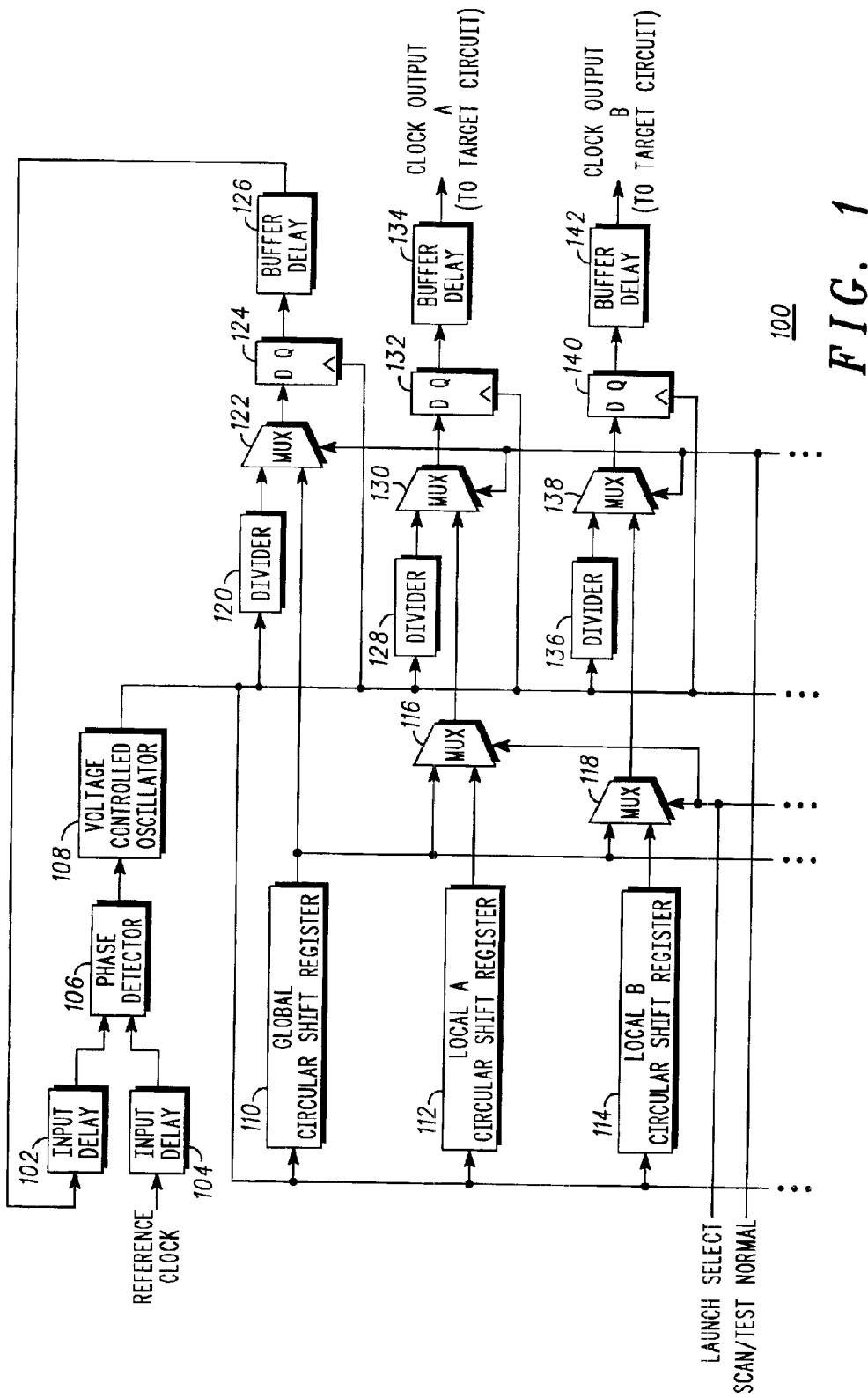
FIG. 1 illustrates in block diagram form, scan clock generation circuitry in accordance with one embodiment of the present invention.

Circuit Connectivity:

FIG. 1. illustrates in block diagram form, scan clock generation circuitry 100 in accordance with one embodiment of the present invention. Scan clock generation circuitry 100 includes input delay 102 and 104, phase detector 106, voltage controlled oscillator (VCO) 108, global circular shift register 110, local A and local B circular shift registers 112 and 114, multiplexers 116, 118, 122, 130, and 138, dividers 120, 128, and 136, storage elements 124, 132, and 140, and buffer delays 126, 134, and 142. Input delay 104 receives reference clock as an input and provides an output to phase detector 106. Phase detector 106 receives an input from input delay 102 and provides an output to VCO 108. VCO 108 provides an output to global circular shift register 110, local A and local B circular shift registers 112 and 114, dividers 120, 128, and 136, and storage elements 124, 132, and 140. Global circular shift register 110 is coupled to multiplexers 116, 118, and 122. Multiplexers 116 and 118 are coupled to local A and local B circular shift registers 112 and 114, respectively, and each receive launch select. Multiplexer 122 is coupled to receive an output of divider 120, an output of global circular shift register 110, and a scan test/normal signal, and is coupled to provide an input to storage element 124. Storage element 124 is coupled to buffer delay 126 which is coupled to input delay 102. Multiplexer 130 is coupled to receive an output of divider 128, an output of multiplexer 116, and the scan test/normal signal, and is coupled to provide an input to storage element 132. Storage element 132 is coupled to buffer delay 134 which provides clock output A. Clock output A is provided to the target circuit (also referred to as the integrated circuit under test or device under test). Multiplexer 138 is coupled to receive an output of divider 136, an output of multiplexer 118, and the scan test/normal signal, and is coupled to provide an input to storage element 140. Storage element 140 is coupled to buffer delay 142 which provides clock output B. Clock output B is provided to the target circuit.

Figure 2:
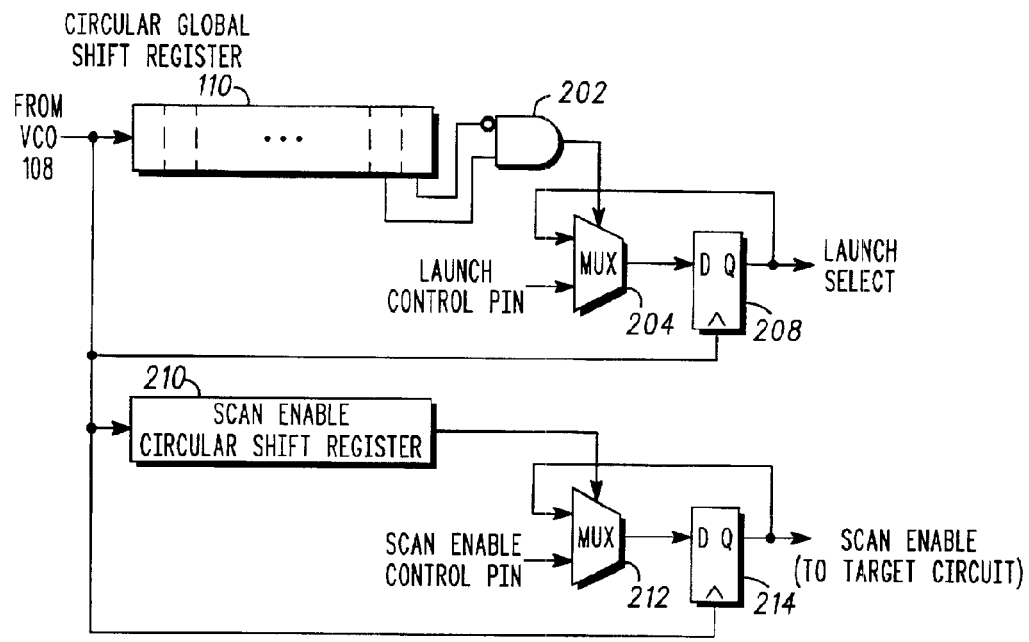
FIG. 2 illustrates in block diagram form, circuitry for generating control signals in accordance with one embodiment of the present invention.

FIG. 2 illustrates control signal generation circuitry 200 in accordance with one embodiment of the present invention. Control signal generation circuitry 200 includes global circular shift register 110, AND gate 202, multiplexers 204 and 212, storage elements 208 and 214, and scan enable circular shift register 210. Global shift register 110 is coupled to AND gate 202, which is coupled to multiplexer 204. Multiplexer 204 is coupled to an output of storage element 208 and a launch control pin. Multiplexer 204 also provides an input to storage element 208. Storage element 208 provides the launch select signal. Scan enable circular shift register 210 is coupled to multiplexer 212 which is coupled to a scan enable control pin and an output of storage element 214. Multiplexer 212 also provides an input to storage element 214. Storage element 214 provides a scan enable signal to the target circuit. Global shift register 110, storage element 208, scan enable circular shift register 210, and storage element 214 are each coupled to VCO 108.

Figure 5:
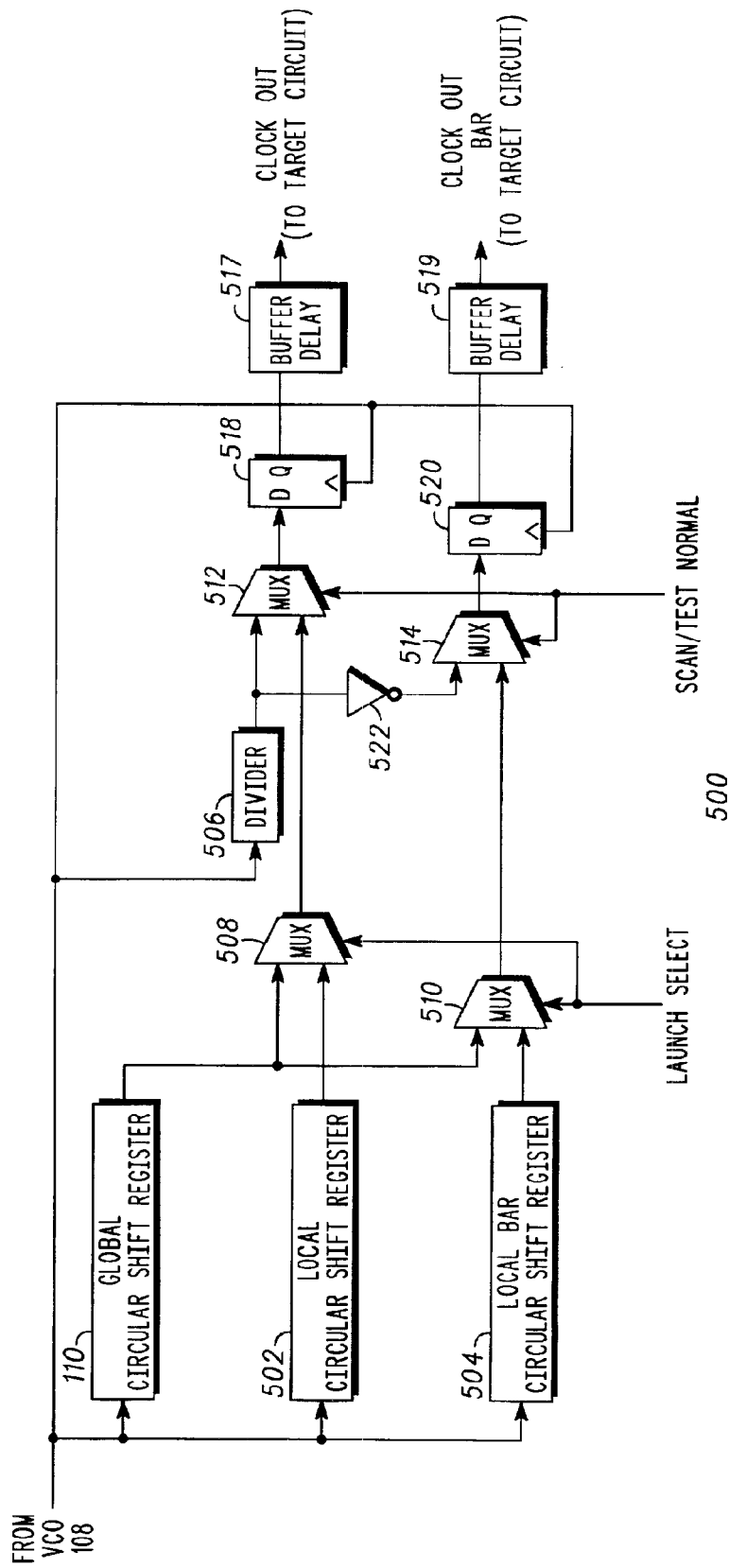
FIG. 5 illustrates in block diagram form, clock inversion circuitry in accordance with one embodiment of the present invention.

FIG. 5 illustrates clock inversion circuitry 500 in accordance with one embodiment of the present invention. Clock inversion circuitry 500 includes global circular shift register 110, local and local bar circular shift registers 502 and 504, multiplexers 508, 510, 512, and 514, divider 506, inverter 522, and storage elements 518 and 520. Global circular shift register 110 is coupled to multiplexers 508 and 510 and VCO 108. Local circular shift register 502 is coupled to multiplexer 508 and VCO 108. Local bar circular shift register 504 is coupled to multiplexer 510 and VCO 108. Multiplexers 508 and 510 receive the launch select signal, and are coupled to multiplexers 512 and 514, respectively. Multiplexer 512 is coupled to divider 506 and storage element 518, and multiplexer 514 is coupled to inverter 522 and storage element 520. Inverter 522 is coupled to divider 506. Multiplexers 512 and 514 each receive the scan test/normal signal. Divider 506, storage element 518, and storage element 520 are each coupled to VCO 108. Storage element 518 is coupled to buffer delay 517 which provides clock out to the target circuit, and storage element 520 is coupled to buffer delay 519 which provides clock out bar to the target circuit.

Figure 6:
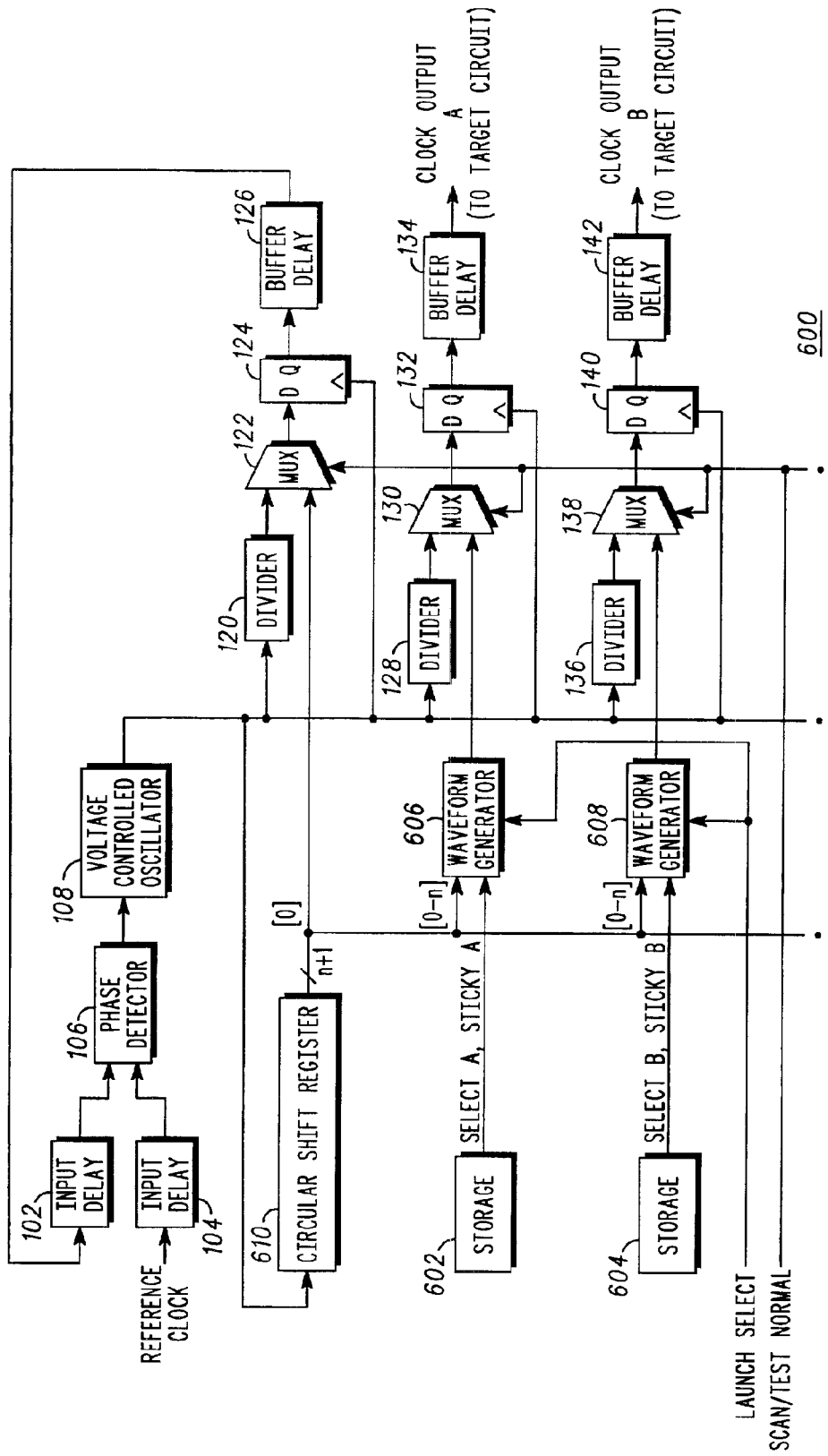
FIG. 6 illustrates in block diagram form, scan clock generation circuitry in accordance with another embodiment of the present invention.

FIG. 6. illustrates scan clock generation circuitry 600 in accordance with an alternate embodiment of the present invention. Scan clock generation circuitry 600 includes input delay 102 and 104, phase detector 106, voltage controlled oscillator (VCO) 108, circular shift register 610, storage 602, storage 604, waveform generators 606 and 608, dividers 120, 128, and 136, multiplexers 122, 130, and 138, storage elements 124, 132, and 140, and buffer delays 126, 134, and 142. Input delay 104 receives reference clock as an input and provides an output to phase detector 106. Phase detector 106 receives an input from input delay 102 and provides an output to VCO 108. VCO 108 provides an output to circular shift register 610, dividers 120, 128, and 136, and storage elements 124, 132, and 140. Waveform generator 606 receives the launch select signal and is coupled to circular shift register 610, storage 602, and multiplexer 130. Waveform generator 608 receives the launch select signal and is coupled to circular shift register 610, storage 604, and multiplexer 138. Multiplexer 122 is coupled to receive an output of divider 120, an output of circular shift register 610, and the scan test/normal signal, and is coupled to provide an input to storage element 124. Storage element 124 is coupled to buffer delay 126 which is coupled to input delay 102. Multiplexer 130 is coupled to receive an output of divider 128, an output of waveform generator 606, and the scan test/normal signal, and is coupled to provide an input to storage element 132. Storage element 132 is coupled to buffer delay 134 which provides clock output A to the target circuit (also referred to as the integrated circuit under test or device under test). Multiplexer 138 is coupled to receive an output of divider 136, an output of waveform generator 608, and the scan test/normal signal, and is coupled to provide an input to storage element 140. Storage element 140 is coupled to buffer delay 142 which provides clock output B to the target circuit.

Figure 7:
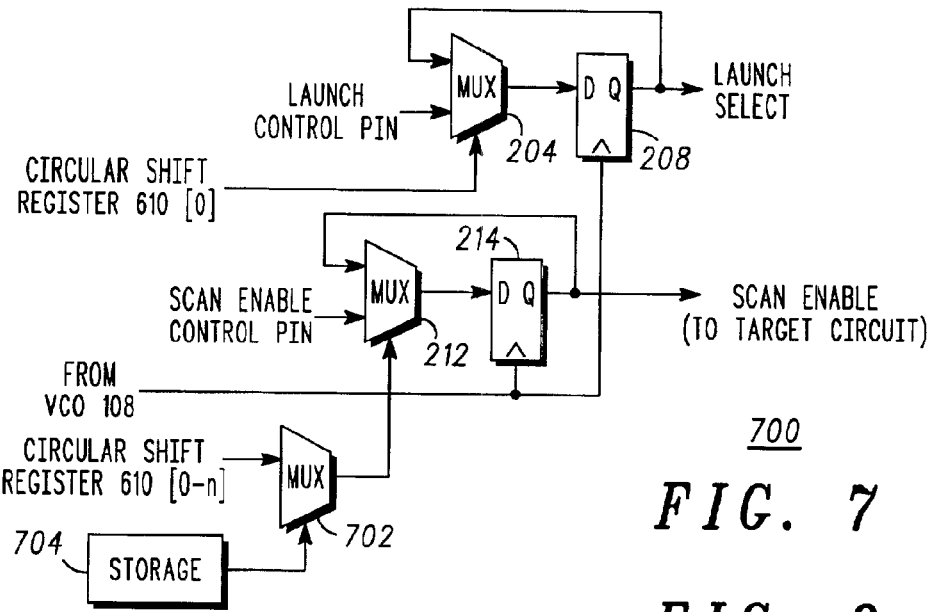
FIG. 7 illustrates in block diagram form, circuitry for generating control signals in accordance with another embodiment of the present invention.

FIG. 7 illustrates control signal generation circuitry 700 in accordance to an alternate embodiment of the present invention. Control signal generation circuitry 700 includes multiplexers 204, 212, and 702, storage elements 208 and 214, and storage 704. Multiplexer 204 is coupled to circular shift register 610, the launch control pin, and an output of storage element 208, and is coupled to provide an input to storage element 208. Storage element 208 provides the launch select signal and is coupled to VCO 108. Multiplexer 212 is coupled to the scan enable control pin and an output of storage element 214, and is coupled to provide an input to storage element 214. Storage element 214 provides the scan enable signal to the target circuit. Multiplexer 702 is coupled to multiplexer 212, circular shift register 610, and storage 704.

Figure 9:
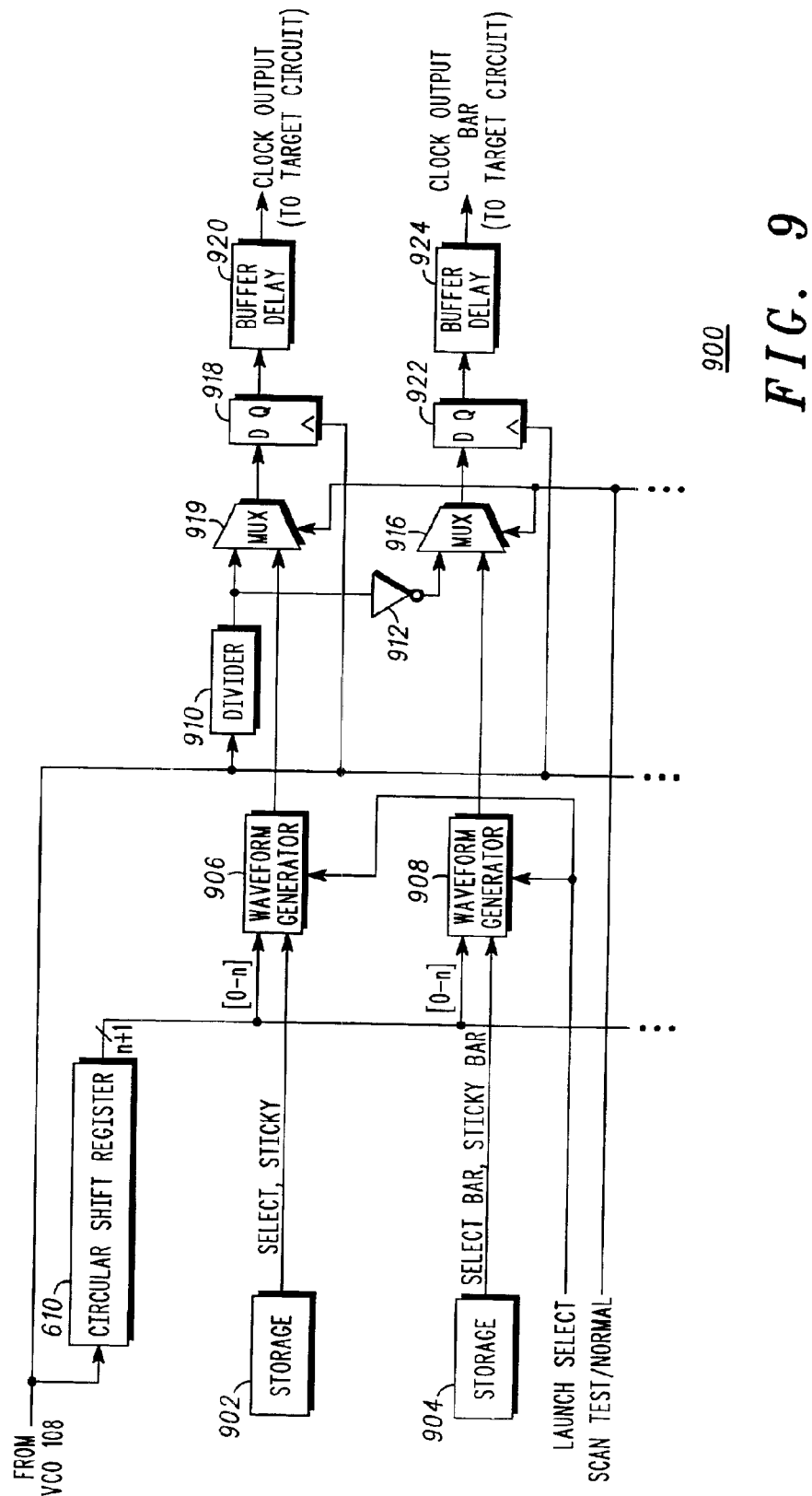
FIG. 9 illustrates in block diagram form, clock inversion circuitry in accordance with another embodiment of the present invention.

FIG. 9 illustrates clock inversion circuitry 900 according to an alternate embodiment of the present invention. Clock inversion circuitry 900 includes circular shift register 610, storage 902, storage 904, waveform generators 906 and 908, multiplexers 919 and 916, divider 910, inverter 912, storage elements 918 and 922, and buffer delays 920 and 924. Circular shift register 610 is coupled to waveform generators 906 and 908 and VCO 108. Waveform generator 906 is coupled to storage 902, circular shift register 610, and multiplexer 919, and receives the launch select signal. Waveform generator 908 is coupled to storage 904, circular shift register 610, and multiplexer 916, and receives the launch select signal. Multiplexer 919 is coupled to divider 910 and storage element 918, and multiplexer 916 is coupled to inverter 912 and storage element 922. Multiplexers 919 and 916 each receive the scan test/normal signal. Storage element 918 provides an output to buffer delay 920 which provides clock output to the target circuit, and storage element 922 provides an output to buffer delay 924 which provides clock output bar to the target circuit.

Circuit Operation:

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Brackets are used to indicate the conductors of a bus or the bit locations of a value. For example, "bus 60 [0–7]" or "conductors [0–7] of bus 60" indicates the eight lower order conductors of bus 60, and "address bits [0–7]" or "ADDRESS [0–7]" indicates the eight lower order bits of an address value. The symbol "$" preceding a number indicates that the number is represented in its hexadecimal or base sixteen form. The symbol "%" preceding a number indicates that the number is represented in its binary or base two form.

In operation, input delay 102, input delay 104, phase detector 106, VCO 108, and divider 120 form a phase lock loop (PLL) frequency generator for a high frequency reference clock which will be divided to lower frequencies for use in various sections or portions of an integrated circuit. These various sections or portions are referred to as clock domains, where each clock domain normally operates at a corresponding frequency which may differ from the operating frequencies of other clock domains within the integrated circuit. Therefore, the reference clock is a lower frequency clock and the output of VCO 108 provides a higher frequency clock signal (also referred to as the VCO clock) to the registers, dividers, storage elements, waveform generators, etc. of FIGS. 1, 2, 5, 6, 7, and 9. Also, other clock sources may exist which provide clock signals to other clock domains which are not based on VCO 108. Therefore, a need exists for a scan tester that can test the integrated circuit and its various clock domains. (Note that throughout the discussions below, the integrated circuit being tested may also be referred to as the target circuit or device under test.) However, as discussed above, problems arise with tester circuitries as operating speeds of the integrated circuit increase. Most of these problems arise from the clock domains which derive their clock signals from VCO 108 due to their high speeds. For example, in one embodiment the normal output of VCO 108 may be 533 MHz which may be difficult or impossible to obtain from an external IC tester. Furthermore, scanning the stimuli and responses at such a high speed (i.e. at the speed of the VCO clock) may cause thermal damage to the integrated circuit. Therefore, FIGS. 1 and 6 illustrate scan clock generation circuitry 100 or 600 that allow for scan testing of the integrated circuit where the stimuli and responses may be scanned in and out at a lower speed while the functional testing may be performed at the target circuit's normal operating speed. For example, in the previous example, the stimuli and responses may be scanned at a frequency of 66 MHz, while the normal output frequency of VCO 108 may be 533 MHz. The reference clock generated from a tester would therefore need to be 66 MHz which can be easily achieved.

In performing scan testing, an initial circuit state (i.e. the stimulus) is shifted into the state elements of the integrated circuit under test. This initial state is chosen such that selected functional circuit paths are sensitized. The final clock edge of the process of setting up the initial state is termed the launch clock edge. The following clock edge is termed the capture clock edge. At the capture clock edge, the response to the stimulus is captured in the state elements of the integrated circuit under test and can therefore be shifted out by the tester. The state elements refer to those elements on the IC under test that are used for scan testing. Therefore, they are used for both functional operations and shift mode operations. The shift mode operations allow the state elements to shift in the initial circuit state or stimulus and shift out the captured response. The functional operations allow the state elements to operate as they normally would on the IC. The scan enable signal is therefore selectively asserted during scan test mode in order to enable the state elements to perform shift mode operations and is negated to enable the state elements to perform functional operations. This scan enable signal will be described further below in reference to FIGS. 2 and 7.

Figure 3:
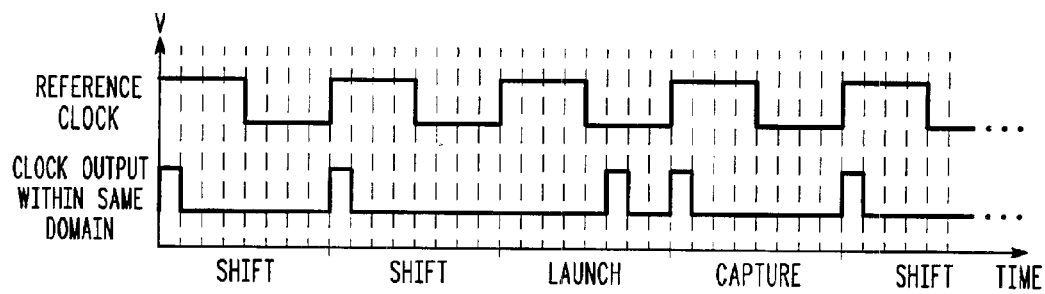
FIGS. 3 and 4 illustrate timing diagrams of clock waveforms generated in accordance with various embodiments of the present invention.

FIG. 3 illustrates one example of a reference clock and a clock output that may be achieved with the scan clock generation circuitry 100 or 600. FIG. 3 illustrates a waveform representative of a reference clock that is received from an external source during scan testing. For example, this reference clock is generally provided by the tester itself. FIG. 3 also illustrates a waveform representative of one of the IC clocks corresponding to one of the clock domains of the target circuit. The dotted lines in FIG. 3 represent the period of the VCO clock (i.e. the output of VCO 108). Therefore, in one embodiment, the reference clock has a period of 8 times the output of VCO 108. However, in alternate embodiments, the reference clock may be any multiple of VCO clock. Also note that each of the rising edges of the clock output occur at an edge of the VCO clock (i.e. at a start of a VCO clock period). This can be seen in FIG. 3 where each rising edge is aligned with a dotted line, where each dotted line is representative of a VCO clock period.

FIG. 3 illustrates that the clock output provides one active edge (or rising edge) per period of the reference clock. (Note that in alternate embodiments, an active edge may refer to a falling edge rather than a rising edge.) This allows the scan input or stimulus to be supplied at the relatively low reference clock frequency (as compared to the frequency of the VCO clock at the output of VCO 108). Note that while the scan input is being supplied, the previous response may be shifted out simultaneously at the same relatively low reference clock frequency. In FIG. 3, the shift periods during which stimulus is supplied and responses monitored are labeled "shift." During these shift periods, a rising edge of a shift pulse is provided to the state elements of the target circuit which is used to supply the stimulus for a subsequent test and monitor the responses captured in response to the stimulus for a previous test. Note that the timing of the rising edge of capture pulse (i.e. the capture clock edge, occurring within the period labeled "capture" in FIG. 3) relative to the reference clock is the same as the timing of the rising edge of the shift pulse relative to the reference clock. Therefore, the shift pulses and capture pulses may each be referred to as a shift/capture pulse. During the launch periods (labeled "launch" in FIG. 3), a rising edge of a launch pulse is provided that is phase shifted from the reference clock as compared to the shift/capture pulses. Note that each of the launch and shift/capture pulses of FIG. 3 have pulse durations which are equivalent to the period of the VCO clock. However, in alternate embodiments, the launch and shift/capture pulses may have pulse durations that are multiples of the period of the VCO clock.

FIG. 3 also illustrates that the response to the stimulus must be valid within the time period between the launch clock edge (i.e. the active or rising edge of the launch pulse) to the capture clock edge (i.e. the active or rising edge of the capture pulse). It can therefore be appreciated that if this time period is designed to correspond to the normal operating frequency period (i.e. the nominal clock period) of the clock domain corresponding to the clock output (which may be considerably less than the period of the reference clock), "at-speed" testing of the integrated circuit can be achieved. In the example of FIG. 3, the normal operating period of the clock output is 3 times the period of the VCO clock (i.e. the capture clock edge occurs 3 dotted lines later than the launch clock edge). However, in alternate embodiments, the normal operating period can be any multiple of the period of the VCO clock. Also, note that the clock output of FIG. 3 corresponds to a selected test path of the target circuit that originates from and terminates at state elements within a same clock domain. (FIG. 4 will be described further below which addresses scan clock generation corresponding to selected test paths of the target circuit which originate from and terminate at state elements within different clock domains.)

Referring back to FIG. 1, scan clock generation circuitry 100 may be used to generate the clock output of FIG. 3, where phase detector 106 and VCO 108 may be referred to as a clock generator and the circuitry coupled to receive the VCO clock may be referred to as clock control circuitry. Scan clock generation circuitry 100 is able to operate in either scan test mode or normal mode, as indicated by the scan test/normal signal. This signal can be an input pin, a value stored within a register or other storage circuitry, or can be decoded from a plurality of values which are stored within a register or storage circuitry or provided by an external source via an input pin or pins. In normal mode, the output of VCO 108 (i.e. the VCO clock) is provided to dividers 128 and 136 which are used to produce clock outputs A and B. Also, the output of VCO 108 is provided to divider 120, the output of which is used in the feedback path as an input to phase detector 106 via input delay 102. Scan clock generation circuitry 100 may also operate in scan test mode where dividers 120, 128, and 136 are bypassed and the outputs of global circular shift register 110, local A circular shift register 112, and local B circular shift register 114 are used to generate the feedback signal to phase detector 106, clock output A, and clock output B, respectively. Input delays 102 and 104 ensure that the feedback signal (from buffer delay 126) is balanced with the external reference clock. Buffer delays 126, 134, and 142 balance clock outputs A and B with the feedback signal (from buffer delay 126) and hence, with the reference clock, too.

Scan clock generation circuitry 100 includes global circular shift register 110 which, in one embodiment, is implemented as a circular shift register used to produce a single pulse for each complete rotation of the circular shift register. In scan test mode, the output of global shift register 110 (rather than the output of divider 120) is provided to the feedback path of phase detector 106. Phase detector 106 (operating within the PLL) will cause VCO 108 to oscillate at a frequency such that global shift register 110 will complete one rotation for each period of the reference clock. That is, VCO 108 will be running at a frequency corresponding to the reference clock frequency multiplied by the length of global shift register 110. (The bit length of global circular shift register 110 is therefore proportional to a ratio of the VCO clock frequency divided by the reference frequency.) Phase detector 106 therefore aligns the pulse indicated by the state sequence information within global circular shift register 110 to the reference clock. Likewise, in scan test mode, dividers 128 and 136 are bypassed by multiplexers 130 and 138 in order to provide the outputs of the global or local registers (110, 112, and 114) as the clock outputs (clock output A and B).

For every period of the reference clock, except the launch period, multiplexers 116 and 118 supply the output of global circular shift register 110 to clock outputs A and B. The outputs of global circular shift register 110 therefore form a waveform of a single pulse during each of the shift and capture periods. This pulse is defined by placing one or more "one" bits in global shift register 110. Since phase detector 106 operates to align the reference clock (received via input delay 104) and the feedback clock (received via input delay 102), it can be appreciated that the output of global shift register 110 will provide the shift/capture pulses of FIG. 3. Note that each shift/capture pulse is aligned with the start of each reference clock, and that the width of the shift/capture pulse can be modified by padding more "ones" into global circular shift register 110. For example, filling half of global circular shift register 110 with ones would produce a 50% duty cycle shift/capture pulse. On the other hand, the launch pulse is phase adjusted in order to provide for "at-speed" testing. This phase adjustment is accomplished through the use of local circular shift registers 112 and 114.

Each of local shift registers 112 and 114 may correspond to different launch points for different clock domains (where the launch point refers to the active edge of the launch pulse). For example, local A circular shift register 112 can be programmed so as to produce the launch pulse of FIG. 3, while local B circular shift register 114 may be programmed so as to produce a launch pulse corresponding to a different clock domain. Multiplexer 116 (corresponding to clock output A) is used to selectively provide either a shift/capture pulse or a launch pulse, based upon the launch select signal. (The generation of this launch select signal will be discussed further below in reference to FIG. 2.) Therefore, when launch select indicates that a launch pulse is required, multiplexer 116 will provide the output of local A circular shift register 112 to multiplexer 130 (bypassing divider 128 due to scan mode being selected by scan test/normal signal) which then provides this output as clock output A. However, when launch select signal indicates that no launch pulse is required for the current reference clock period (i.e. that a shift/capture pulse is required instead), multiplexer 116 will provide the output of global circular shift register 110 as clock output A. Therefore, global circular shift register 110 and local A circular shift register 112 may be used to generate the waveforms of the clock output illustrated in FIG. 3. (Local B circular shift register 114 operates the same way as local A circular shift register 112, and may be used to provide another launch pulse for a different clock domain.)

Note that while FIG. 1 illustrates only two local shift registers 112 and 114, any number of local shift registers may be used to accommodate all clock domains of the target circuit. That is, each local register can correspond to a launch pulse of a different clock domain. For each clock domain, another local register, divider, multiplexers, storage element, and buffer delay like local A circular shift register 112, divider 128, multiplexers 116 and 130, storage element 132, and buffer delay 134, respectively, may be repeated where the VCO clock, launch select signal, and scan test/ normal signal are provided to the appropriate elements, as indicated by the continuation dots in FIG. 1. Therefore, the circuitry of FIG. 1 is easily expandable due to its modular nature.

Figure 4:
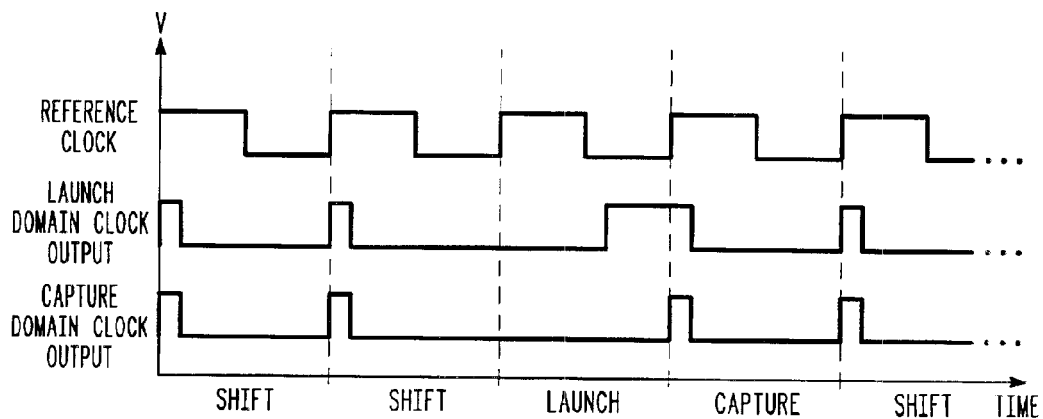

Scan clock generation circuitry 100 may also be used to generate the clock output waveforms of FIG. 4. In some cases, the selected paths may originate from state elements within a first clock domain (i.e. a launch domain) and terminate at state elements within a second clock domain (i.e. a capture domain) that is different from the first clock domain. In this case, the initial state defined by the scan test pattern may encompass state elements of both the launch and capture clock domains, meaning both clock domains should be provided with shift pulses. However, during a launch period, only the state elements of the launch domain should be clocked. Likewise, during a capture period, only the state elements of the capture domain should be clocked. Therefore, two different clock outputs need to be provided where one corresponds to the launch domain clock output and the second one corresponds to the capture domain clock output. For example, FIG. 4 illustrates both a lunch domain clock output and a capture domain clock output. The launch domain clock output includes shift pulses during the shift periods (labeled "shift" in FIG. 4), and a launch pulse during the launch period (labeled "launch"). However, the launch pulse has been "padded" by ones in order to "stretch" the pulse to the end of the reference clock period. At the start of the following period (the capture period) a shift/capture pulse is provided which is aligned with the reference clock by way of phase detector 106, as was described above. However, this pulse "merges" with the previous launch pulse to effectively form a single pulse spanning parts of both the launch and capture periods. Therefore, only a single rising edge is provided to the state elements of the launch domain by the launch domain clock output during both the launch and capture periods, meaning that effectively no pulse (e.g. rising edge) is provided to the state elements of the launch domain during the capture period. Likewise, the capture domain clock output includes shift pulses during the shift periods (labeled "shift" in FIG. 4), and a capture pulse during the capture period (labeled "capture"). Note that in this case, no launch pulse is provided during the launch period. Therefore, only a capture pulse is provided to the state elements of the capture domain.

Scan clock generation circuitry 100 may therefore be used to generate the launch domain and capture domain clock outputs of FIG. 4. For example, local A circular shift register 112 may be used to generate the launch domain clock output while local B circular shift register 114 may be used to generate the capture domain clock output. Local A circular shift register 112 stores a "one" at the point where the launch pulse edge is desired, and the rest of the locations following this point are padded with ones so as to produce the extended launch pulse. Local B circular shift register 114, however, is cleared (loaded to all zeros) such that during the launch period, when the local B circular shift register 114 is selected by multiplexer 118, no pulse is provided as clock output B. Thus it can be appreciated how the circuitry of FIG. 1 may be used to provide any combination of launch and shift/capture pulses to various clock domains to achieve at-speed testing.

Also note that the output of VCO 108 which is applied as the clock to most of the elements of FIGS. 1 and 2, such as, for example, global register 110, local A and local B registers 112 and 114, storage elements 122, 132, 140, 208, and 212, and scan enable register 210 is balanced. This allows all registers to be used as a single synchronous state machine in that all the registers update at the same time and therefore, all transitions are valid at the same time. This eliminates any concern that upon the transition of one register, other register values are invalid. The VCO clock therefore ensures that clock outputs A and B are in phase with the PLL feedback signal from buffer delay 126 (and, by implication, the reference clock) at any time that the launch select signal is negated (such as during shift and capture periods) and the scan test signal is asserted, since this causes the output of global circular shift register 110 to be presented to all storage elements 124, 132, and 140 in unison.

FIG. 2 illustrates the circuitry for generating the launch select signal and the scan enable signal. The launch select signal indicates the period during which a launch pulse is required (e.g. indicates when the local registers rather than the global register of FIG. 1 are output as the clock output). The scan enable signal indicates to the integrated circuit under test when the state elements should be configured to either the functional mode of operation or shift mode of operation. For example, during shift periods, all state elements operate in the shift mode to receive the stimulus for a test or provide the captured results of a previous test. However, during capture periods, the state elements operate in functional mode to capture the normal functional circuit response to the stimulus.

FIG. 2 includes launch select and scan enable control circuitry 200. Control circuitry 200 includes an AND gate 202 coupled to global shift register 110 which indicates when a next reference clock period is about to begin by detecting two different values (a "1" and a "0") at the last two locations of global shift register 110. (Note that the bubble at the first input of AND gate 202 indicates that the input is first negated.) The output of AND gate 202 causes multiplexer 204 to select between the launch control pin (which is an I/O pin of the integrated circuit accessible by the tester) and the feedback of register element 208. When the feedback path is selected, register element 208 holds its present state; however, when the launch control pin is selected, register element 208 assumes a new state equal to the value of the launch control pin. Therefore, when the launch control pin is asserted, a launch period of the reference clock is indicated. (Note that the launch select signal was also discussed above with reference to FIG. 1.) The launch select signal should be valid at every rising edge of the VCO clock. Furthermore, any transition of the launch select signal should occur after the last edge of the VCO clock prior to the rising edge of the next reference clock period. Therefore, AND gate 202 detects the phase of global shift register 110 and provides a pulse to indicate the last VCO clock edge of the current reference clock period. This ensures the proper timing of the launch select signal, which can be a stringent timing requirement due to the high speeds of the normal operating frequency of the target circuit. By ignoring the launch control pin at all times except when indicated by AND gate 202 detecting the last VCO edge of the current reference clock period, the appropriate value of the launch control pin for the next reference clock period can be set up according to relatively loose timing requirements as compared to the timing requirements of the launch select signal.

The scan enable signal should be asserted during every shift pulse and negated during the capture pulse. It may be asserted or negated during the launch pulse as determined by the scan pattern generation software tool. For example, a scan launch pattern requires that the scan enable signal be asserted during the launch pulse. However, a functional launch pattern requires that the scan enable signal be negated during the launch pulse. Since the time period between the launch pulse and capture pulse can be as small as one VCO clock period, the signal timing of the scan enable signal must be adjustable in increments of the VCO clock period. Scan enable shift register 210 includes a single one bit offset from global circular shift register 110 to indicate to multiplexer 212 when to sample the scan enable control pin (which is another I/O pin of the integrate circuit under test that is accessible by the scan tester). The offset will determine when to assert the scan enable. This offset depends on the pattern being applied (e.g. a scan launch or a functional launch). That is, the scan enable should be negated at some point between the capture pulse and the previous shift pulse and asserted at some point between the capture pulse and the subsequent shift pulse. However, the specific timing of the negation (whether it occurs before or after the rising edge of the launch pulse) depends on the pattern being applied. While the timing of the scan enable may be more stringent, scan enable shift register 210, via multiplexer 212, allows for the timing of the scan enable control pin to be loose as compared to the timing of the scan enable signal.

FIG. 5 illustrates clock inversion circuitry 500 that may be used with scan clock generation circuitry 100. Global circular shift register 110 is the same global circular shift register as in FIG. 1. Buffer delays 517 and 519 operate similar to buffer delays 134 and 142 of FIG. 1. Local circular shift register 502 and local bar circular shift register 504 operate similar to the local A and B circular shift registers 112 and 114 of FIG. 1. During normal operation, the output of divider 506 is output via multiplexer 612 to storage element 518 which outputs clock out to the target circuit (via buffer delay 517). Multiplexer 514 outputs the inverse of the output of divider 506 (via inverter 522) to storage element 520 which outputs clock out bar to the target circuit (via buffer delay 519). Therefore, during normal operation, clock out bar is simply the inverse of clock out. However, during scan test mode operation, as selected by the scan test/normal signal input to multiplexers 512 and 514, the outputs of multiplexers 508 and 510 are output as clock out and clock out bar, respectively. For shift/capture pulses, the output of global circular shift register 110 is output via multiplexer 508, while for launch pulses, the outputs of local circular shift register 502 and local bar circular shift register 504 are output via multiplexer 510. Therefore, the clock out bar, in scan test mode, corresponds to a separate clock domain that can be programmed via local bar circular shift register 504 and is not simply the inverse of clock out. Thus, in normal mode, clock out and clock out bar are dependent signals, while in scan test mode, they may be programmed to be independent of each other. This allows for greater flexibility since scan test patterns may test paths which cross between the clock out and clock out bar domains. Therefore, FIG. 1 may include the circuitry of FIG. 5 to allow for clock inversion.

FIG. 6 illustrates scan clock generation circuitry 600 in accordance with an alternate embodiment of the present invention. Input delays 102 and 104, phase detector 106, VCO 108, dividers 120, 128, and 136, multiplexers 122, 130, and 138, storage elements 124, 132, and 140, and buffer delays 126, 134, and 142 operated as they did in FIG. 1 and therefore, they will not be addressed again separately here. Scan clock generation circuitry 600 does not include the global and local shift registers as did the embodiment of FIG. 1. Instead, only a single circular shift register 610 may be used to generate all the clock outputs (e.g. clock output A and clock output B) for each clock domain. This relieves the loading on the VCO clock because only one register is driven by VCO 108 rather than all the global and local shift registers as in FIG. 1. Circular shift register 610 is used to store a state sequence while the local shift registers can be replaced with static registers (e.g. storage 602 and 604) which hold state detect encoding information corresponding to each clock domain. These static registers can be clocked with a different clock and do not require the VCO clock. For example, the JTAG clock can be used for storage elements 602 and 604 which prevents the excessive loading of VCO 108. Also, the information stored in these static registers may be encoded in a more compact format than the local circular shift registers of FIG. 1, for an overall reduction in the number of storage bits.

Storage 602 provides waveform generator 606 tap information corresponding to circular shift register 610 in order to form the desired scan clock waveform during a launch period. During shift/capture periods (when launch select signal is negated), waveform generators 606 and 608 simply output the feedback tap which in this embodiment is circular shift register 610 [0]. That is, circular shift register 610 [0] is the value that gets fed back to the input of phase detector 106, hence it is referred to as the feedback tap. Note that in alternate embodiments, any position within circular shift register 610 (i.e. any tap within 0 through n) can be the feedback tap since phase detector 106 will operate to align the feedback tap with the reference clock. However, when launch select is asserted (i.e. during a launch period) waveform generator 606 uses circular shift register 610 [0–n], select A and sticky A to output clock output A in accordance with the table of FIG. 8. Likewise, during a launch period, waveform generator 608 uses select B and sticky B from storage 604 and circular shift register 610 [0–n] to output clock output B in accordance with the table of FIG. 8.

Figure 8:
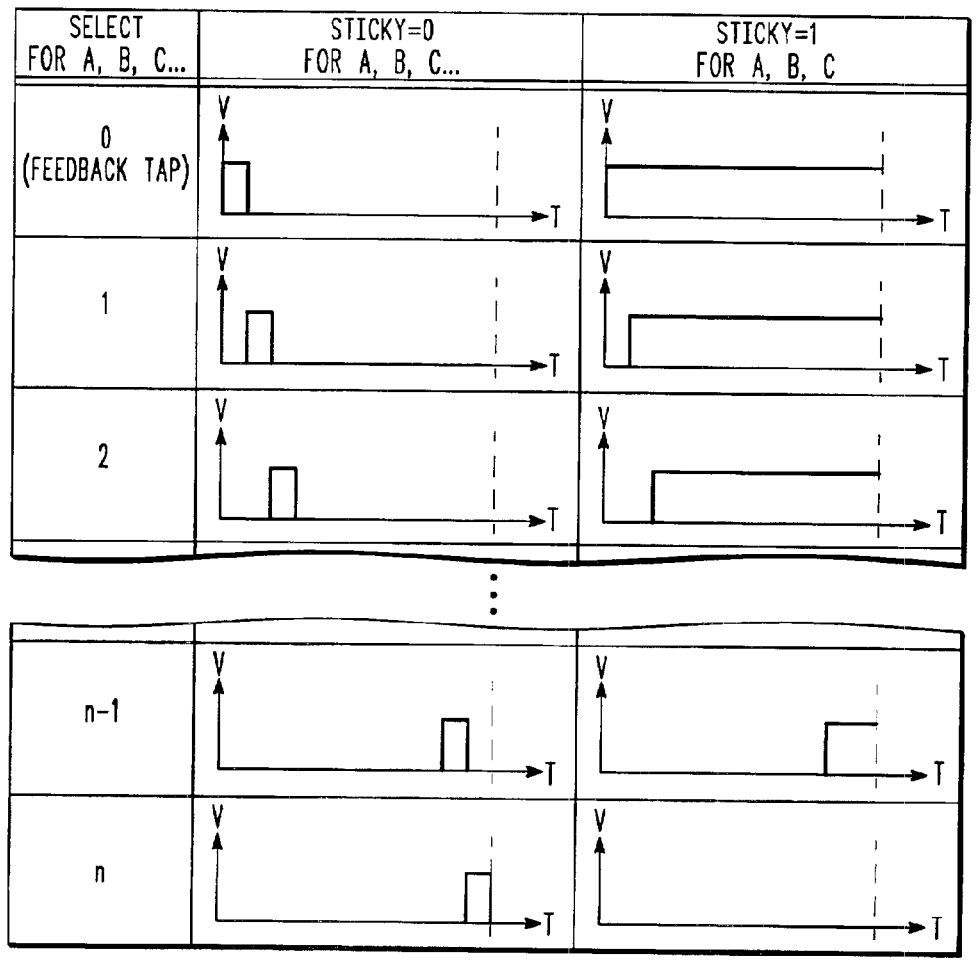
FIG. 8 illustrates a table of clock waveforms generated in accordance with another embodiment of the present invention.

The table of FIG. 8 illustrates the output clock waveforms corresponding to the select and sticky values received from the static storage (such as storage 602) during launch periods where A, B, C . . . refers to the possible clock domains (where only A and B are illustrated in FIG. 6). (Note that the table of FIG. 8 can be implemented within waveform generators 606 and 608 as a lookup table, combinational logic, or in any other appropriate way.) For example, circular shift register 610 may include n+1 taps (corresponding to each of its n+1 bits, numbered from 0 to n). As described above, each waveform generator receives circular shift register 610 [0], i.e. the feedback tap, which is output during shift/capture periods. Each waveform generator (for each clock domain) also has another tap that is independently programmable (via select A and select B). Each of select A and select B is an m-bit value that can select one of the n+1 tap values from circular shift register 610. For example, if circular shift register 610 is an 8 bit register (thus having 8 tap values), select A may be a 3-bit binary value which selects one of the 8 tap values. Therefore, during a launch period, waveform generator 606 taps into circular shift register 610 at the selected one of the 8 tap values in order to output the appropriate waveform (i.e. launch pulse) via clock output A. For example, if select A indicates tap 2, then waveform generator 606 uses circular shift register 610 [2] to output either the waveform corresponding to sticky=0 or to sticky=1 depending on the value of sticky A. (These clock waveforms are provided in the table of FIG. 8 in the row where select for A, B, C . . . is equal to 2.) The select values therefore select the phase of the launch pulse while the sticky values select the pulse duration.

The sticky A and sticky B received from storage circuitries 602 and 604 indicated to waveform generators 606 and 608 when clock output A and clock output B need to be padded with ones (as was described in reference to FIG. 4 above). Therefore, clock output A can represent the launch clock domain and clock output B can represent the capture clock domain, as was described above, because sticky A allows for clock output A to be padded by ones within the launch period. Also note that the waveforms of table 8 allow for a reference clock period without a pulse, which may be used by clock output B which, in this example, represents the capture clock domain and requires no pulse during the launch period. Therefore, a tap selection of n generates no pulse.

Also, as with FIG. 1 above, any number of clock domains can be accommodated with the circuitry of FIG. 6 by having waveform generators and select and sticky values for each additional clock output needed. However, as more circuitry is added, minimal additional loading of the VCO clock is introduced because the local registers using the VCO clock (as in FIG. 1) are no longer needed for each added clock output. Instead, storage devices such as storage devices 602 and 604 may be used which need not utilize the VCO clock. As with FIG. 1, the circuitry of FIG. 6 is easily expandable due to its modular nature.

FIG. 7 illustrates control signal generation circuitry 700 according to an alternate embodiment of the present invention which may be used with scan clock generation circuitry 600. Control signal generation circuitry 700 is similar to the circuitry of FIG. 2, however, the tap method of FIG. 6 is implemented. Multiplexer 204 either holds the current state of storage elements 208 or passes the value of the launch control pin to storage element 208, depending on the feedback tap value (circular shift register 610 [0]). Therefore, as described above with reference to FIG. 2, the timing of launch control pin can be looser compared with the timing of the launch select signal (the launch control pin and launch select signal are the same as was described above with reference to FIG. 2.)

Similarly, multiplexer 212 either holds the current state of storage element 214 or passes the value of the scan enable control pin to storage element 214, based on the output of multiplexer 702. Rather than implementing scan enable circular shift register 210, a select value is provided from multiplexer 702. Storage 704 provides a select signal to multiplexer 702 such that multiplexer 702 selects one of circular shift register 610 [0–n] to pass through as the select signal for multiplexer 212. Therefore, storage 704 provides a tap into circular shift register 210 which allows for the correct timing of the scan enable signal. This timing is as was described above with reference to FIG. 2.

FIG. 9 illustrates clock inversion circuitry 900 in accordance with an alternate embodiment of the present invention. Clock inversion circuitry 900 is similar to clock inversion circuitry 500, but is implemented without the use of local and local bar circular shift registers 502 and 504. Therefore, clock inversion circuitry 900 can be implemented with scan clock generation circuitry 600 of FIG. 6. Circular shift register 610 is similar to global circular shift register 110, and divider 910, inverter 912, multiplexers 919 and 916, and storage elements 918 and 922 function similarly to divider 506, inverter 522, multiplexers 512 and 514, and storage elements 518 and 520. That is, in normal operating mode, divider 910 is used to output clock output (via multiplexer 919 and storage element 918), and clock output bar which is simply the inverse of clock bar (output from divider 910 via inverter 912). In scan test mode, clock output bar is independent of clock output and is programmed separately via storage 904 and waveform generator 908. Therefore, storage 902 and 904 and waveform generators 906 and 908 replace the local and local bar circular shift registers 502 and 504 and multiplexers 508 and 510 of FIG. 5. Storage 902 and 904 and waveform generators 906 and 908 operate as those storage circuitries and waveform generators of FIG. 7. That is, during shift/capture periods, waveform generators 906 and 908 output the feedback tap of circular shift register 610 and during launch periods, waveform generators 906 and 908 use select, select bar, sticky, and sticky bar to output waveforms via clock output and clock output bar according to the table of FIG. 8. (Also note that buffer delays 920 and 924 operate like buffer delays 134 and 142 of FIG. 7.) Therefore, as discussed in reference to FIG. 5, during scan test mode, clock output bar can be programmed independent of clock output and can therefore be used to scan test paths which cross over from the clock output domain to the clock output bar domain or vice versa.

Note that while the embodiments of FIGS. 6, 7, and 9 only illustrates one circular shift register 610, alternate embodiments may use more than one circular shift registers while still reducing the loading on the output of VCO 108. Also, the feedback tap can be any position within circular shift register 610 and is not limited to circular shift register 610 [0]. As mentioned above, any of the circular shift registers described herein in reference to FIGS. 1–9 can be implemented with other structures to store state sequence information used for generating the clock waveforms, such as, for example, counters, state machines, etc. Alternatively, any storage device may be used to store state sequence information or to provide state detect encoding information. Also, note that although storage elements 124, 132, 140, 208, 214, 518, 520, 918, and 922 are illustrated in the figures as D flip flops, any appropriate type of storage element, device, or latch may be used. Also, the table of FIG. 8 can use any type of values and be organized in any manner that provides the desired waveforms during the launch and capture/shift periods.

Although the invention has been described with respect to specific conductivity types or polarity of potentials, skilled artisans appreciate that conductivity types and polarities of potentials may be reversed. For example, either active high or active low signals may be implemented for the various signals discussed above.

In the foregoing specification, the invention has been described with reference to specific embodiments. However, one of ordinary skill in the art appreciates that various modifications and changes can be made without departing from the scope of the present invention as set forth in the claims below. For example, the circuitry described herein can be embodied in a single integrated circuit, or more than one integrated circuits, or in a combination of hardware and software. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A scan clock circuit comprising:
   a clock generator for receiving a reference clock having a first frequency and providing a high frequency operating clock having a second frequency that is higher than the first frequency; and
   clock control circuitry coupled to the clock generator for receiving the high frequency operating clock, the clock control circuitry comprising:
   a first storage device for providing a shift/capture clock signal that is in phase with the reference clock by having first predetermined stored bits that are clocked to provide the shift/capture clock signal;
   a second storage device for providing a launch clock signal for scan testing having a same frequency as the shift/capture clock frequency, the second storage device having second predetermined stored bits that provide a clock pulse so that when a period of the launch clock signal is followed by the shift/capture clock signal, a pulse-to-pulse delay between the launch clock signal and the shift/capture clock signal is equal to a nominal clock period of a predetermined clock domain to permit scan test launching and capturing in a domain-specific at-speed period much shorter than a period of the reference clock; and
   a third storage device for providing a second launch signal for scan testing in another predetermined clock domain, the third storage device having third predetermined stored bits that provide another clock pulse so that the pulse-to-pulse delay between the second launch signal and the shift/capture clock signal is equal to a corresponding nominal clock period of the another predetermined clock domain.

2. The scan clock circuit of claim 1 wherein each of the first storage device and the second storage device each is a circular shift register.

3. The scan clock circuit of claim 1 wherein a bit length of first and second storage devices is proportional to a ratio of the second frequency divided by the first frequency.

4. The scan clock circuit of claim 1 further comprising:
   multiplexing circuitry coupled to the clock generator, the first storage device and the second storage device, the multiplexing circuitry selectively outputting either an integer divided version of the high frequency operating clock during a normal mode of operation or outputting outputs of the first storage device and the second storage device during a scan test mode of operation.

5. The scan clock circuit of claim 1 wherein the clock generator further comprises:
feedback circuitry coupled to the first storage device for providing the shift/capture clock signal as a feedback signal to the clock generator; and
delay circuitry coupled to the reference clock and the feedback signal for ensuring that the reference clock and the feedback signal maintain a substantially same phase relationship.

6. The scan clock circuit of claim 5 wherein the feedback circuitry selectively provides the feedback signal either as an integer divided version of the high frequency operating clock during a normal mode of operation or as the output of the first storage device during a scan test mode of operation.

7. The scan clock circuit of claim 1 wherein the first predetermined stored bits comprise a plurality of bits having a first logic state and a single bit of an opposite logic state.

8. The scan clock circuit of claim 1 wherein the clock generator comprises a phase locked loop having a phase detector having a first input for receiving the reference clock and an output coupled to an input of a voltage controlled oscillator, the voltage controlled oscillator having an output coupled to the first storage device, an output of the first storage device being selectively delayed and coupled to a second input of the phase locked loop as a feedback signal, the output of the first storage device being selectively delayed to maintain a substantially same phase between the reference clock and the feedback signal.

9. The scan clock circuit of claim 8 wherein the shift/capture clock signal and the launch clock signal of the predetermined clock domain are selectively delayed to maintain a substantially same phase with the feedback signal.

10. The scan clock circuit of claim 1 further comprising:
an input for receiving an external scan enable signal enabling either functional clocking or scan shifting in a target circuit;
a third storage device for providing a scan enable signal for scan testing, the third storage device having third predetermined stored bits correlated with the first predetermined stored bits; and
enable control circuitry coupled to the third storage device, the enable control circuitry using the third predetermined stored bits to provide an internal scan enable signal and allowing the internal scan enable signal to change state only at a predetermined phase of the reference clock signal.

11. The scan clock circuit of claim 1 further comprising:
an input for receiving a launch control signal used only in a scan test mode; and
control circuitry coupled to the first storage device for using the first predetermined stored bits to provide an internal launch select signal and allowing the internal launch select signal to change state only at a predetermined phase of the reference clock.

12. A scan clock circuit comprising:
a clock generator for receiving a reference clock having a first frequency and providing a high frequency operating clock having a second frequency that is higher than the first frequency; and
clock control circuitry coupled to the clock generator for receiving the high frequency operating clock, the clock control circuitry comprising:
a first storage device for providing a shift/capture clock signal that is in phase with the reference clock by having first predetermined stored bits that are clocked to provide the shift/capture clock signal;
a second storage device for providing a launch clock signal for scan testing having a same frequency as the shift/capture clock frequency, the second storage device having second predetermined stored bits that provide a clock pulse so that when a period of the launch clock signal is followed by the shift/capture clock signal, a pulse-to-pulse delay between the launch clock signal and the shift/capture clock signal is equal to a nominal clock period of a predetermined clock domain to permit scan test launching and capturing in a domain-specific at-speed period much shorter than a period of the reference clock; and
multiplexing circuitry coupled to the first storage device and the second storage device, the multiplexing circuitry selectively implementing a scan test launch and capture operation by selectively providing the launch clock signal.

13. A scan clock circuit comprising:
a clock generator for receiving a reference clock having a first frequency and providing a high frequency operating clock having a second frequency that is higher than the first frequency; and
clock control circuitry coupled to the clock generator for receiving the high frequency operating clock, the clock control circuitry comprising:
a first storage device for providing a shift/capture clock signal that is in phase with the reference clock by having first predetermined stored bits that are clocked to provide the shift/capture clock signal;
a second storage device for providing a launch clock signal for scan testing having a same frequency as the shift/capture clock frequency, the second storage device having second predetermined stored bits that provide a clock pulse so that when a period of the launch clock signal is followed by the shift/capture clock signal, a pulse-to-pulse delay between the launch clock signal and the shift/capture clock signal is equal to a nominal clock period of a predetermined clock domain to permit scan test launching and capturing in a domain-specific at-speed period much shorter than a period of the reference clock, wherein bit values of the second predetermined bits are varied to vary the pulse-to-pulse delay between the launch clock signal and the shift/capture clock signal without varying the first frequency of the reference clock.

14. A scan clock circuit comprising:
a clock generator for receiving a reference clock having a first frequency and providing a high frequency operating clock having a second frequency that is higher than the first frequency; and
clock control circuitry coupled to the clock generator for receiving the high frequency operating clock, the clock control circuitry comprising:
a first storage device for providing a shift/capture clock signal that is in phase with the reference clock by having first predetermined stored bits that are clocked to provide the shift/capture clock signal;
a second storage device for providing a launch clock signal for scan testing having a same frequency as the shift/capture clock frequency, the second storage device having second predetermined stored bits that provide a clock pulse so that when a period of the launch clock signal is followed by the shift/capture clock signal, a pulse-to-pulse delay between the launch clock signal and the shift/capture clock signal is equal to a nominal clock period of a predetermined clock domain to permit scan test launching and capturing in a domain-specific at-speed period much shorter than a period of the reference clock; and a first output terminal and a second output terminal for providing the high frequency operating clock in a divided form and an inverse thereof during a non-test mode, the first storage device and the second storage device being coupled to the first output terminal for providing the shift/capture clock signal and the launch clock signal at the first output terminal during a test mode; and a third storage device for providing the shift/capture clock signal and a second launch signal for an independent clock domain during the test mode, wherein signals at the first output terminal and the second output terminal are dependent on each other during the non-test mode and are independent of each other during the test mode.

15. A method of scan testing a target circuit having at least one clock domain comprising:

receiving a reference clock;

providing a shift/capture clock signal to the target circuit, the shift/capture clock signal being in phase with the reference clock; and providing a launch clock signal for scan testing having a phase relationship relative to the shift/capture clock signal such that when a period of the launch clock signal is followed by the shift/capture clock signal, a pulse-to-pulse delay between the launch clock signal and the shift/capture clock signal is equal to a nominal clock period of the at least one clock domain to permit scan test launching and capturing in a domain-specific at-speed period much shorter than a period of the reference clock;

wherein the method further comprises:

implementing the target circuit with a plurality of clock domains and providing a plurality of launch clock signals equal in number to the plurality of clock domains wherein the phase relationship of each launch clock signal relative to the shift capture clock signal is such that a pulse-to-pulse delay between each of the plurality of launch clock signals and the shift/capture clock signal is equal to a nominal clock period of each of the plurality of clock domains to permit scan test launching and capturing at-speed in each of the plurality of clock domains.

16. The method of claim 15 further comprising:

generating first and second output signals at first and second output terminals wherein the first and second output signals are dependent on each other by being inverses during a non-test mode and the first and second output signals are independent of each other during a test mode.

17. A scan clock circuit comprising:

a clock generator for receiving a reference clock having a first frequency and providing a high frequency operating clock having a second frequency that is higher than the first frequency;

a global storage device coupled to the clock generator for receiving the high frequency operating clock, the global storage device storing a sequence of state values;

a first local storage device for storing a phase control signal;

clock waveform generation circuitry having a first input coupled to the global storage device for receiving the sequence of state values, a second input coupled to the first local storage device for receiving the phase control signal, a control input for receiving a test control signal, and an output for providing a scan test clock having the first frequency, the scan test clock generating shift and capture cycles having a pulse of predetermined phase and duration when the test control signal is negated and generating a launch cycle of the scan test clock when the test control signal is asserted and having a pulse of differing phase that creates a pulse-to-pulse delay between the launch cycle and an immediately following capture cycle that is equal to a nominal clock period of a predetermined clock domain to permit scan test launching and capturing in a domain-specific at-speed period much shorter than a period of the reference clock; and output logic circuitry coupled to the high frequency operating clock and to the clock waveform generation circuitry, the output logic circuitry providing a divided version of the high frequency clock during a normal mode of operation and providing the scan test clock during a test mode of operation; and a second local storage device for storing a second phase control signal corresponding to an additional independent clock domain; and second clock waveform generation circuitry having a first input coupled to the global storage device for receiving the sequence of state values, a second input coupled to the second local storage device for receiving the second phase control signal, a control input for receiving the test control signal, and an output for providing a second scan test clock having the first frequency, the second scan test clock generating shift and capture cycles having a pulse of predetermined phase and duration when the test control signal is negated, and generating a launch cycle of the second scan test clock having a pulse of differing phase from the shift and capture cycles and from the launch cycles of the clock waveform generation circuitry that creates a pulse-to-pulse delay between the launch cycle and an immediately following capture cycle that is equal to a second nominal clock period of the additional independent clock domain.

18. The scan clock circuit of claim 17 wherein the global storage device is a circular shift register and the sequence of state values is a plurality of bits of a first logic value and a single bit of a second, opposite logic value, the plurality of bits being correlated to a ratio of the high frequency operating clock and the first frequency of the reference clock.

19. A scan clock circuit comprising:

a clock generator for receiving a reference clock having a first frequency and providing a high frequency operating clock having a second frequency that is higher than the first frequency;

a global storage device coupled to the clock generator for receiving the high frequency operating clock, the global storage device storing a sequence of state values;

a first local storage device for storing a phase control signal;

clock waveform generation circuitry having a first input coupled to the global storage device for receiving the sequence of state values, a second input coupled to the first local storage device for receiving the phase control signal, a control input for receiving a test control signal, and an output for providing a scan test clock having the first frequency, the scan test clock generating shift and capture cycles having a pulse of predetermined phase and duration when the test control signal is negated and generating a launch cycle of the scan test clock when the test control signal is asserted and having a pulse of differing phase that creates a pulse-to-pulse delay between the launch cycle and an immediately following capture cycle that is equal to a nominal clock period of a predetermined clock domain to permit scan test launching and capturing in a domain-specific at-speed period much shorter than a period of the reference clock, wherein the pulse of differing phase generated by the clock waveform generation circuitry during the launch cycle of the scan test clock has a phase that is determined by both the sequence of state values and the phase control signal; and output logic circuitry coupled to the high frequency operating clock and to the clock waveform generation circuitry, the output logic circuitry providing a divided version of the high frequency clock during a normal mode of operation and providing the scan test clock during a test mode of operation.

20. A scan clock circuit comprising:

a clock generator for receiving a reference clock having a first frequency and providing a high frequency operating clock having a second frequency that is higher than the first frequency;

a global storage device coupled to the clock generator for receiving the high frequency operating clock, the global storage device storing a sequence of state values;

a first local storage device for storing a phase control signal;

clock waveform generation circuitry having a first input coupled to the global storage device for receiving the sequence of state values, a second input coupled to the first local storage device for receiving the phase control signal, a control input for receiving a test control signal, and an output for providing a scan test clock having the first frequency, the scan test clock generating shift and capture cycles having a pulse of predetermined phase and duration when the test control signal is negated and generating a launch cycle of the scan test clock when the test control signal is asserted and having a pulse of differing phase that creates a pulse-to-pulse delay between the launch cycle and an immediately following capture cycle that is equal to a nominal clock period of a predetermined clock domain to permit scan test launching and capturing in a domain-specific at-speed period much shorter than a period of the reference clock, wherein the phase control signal further determines pulse duration of the scan test clock during the launch cycle; and output logic circuitry coupled to the high frequency operating clock and to the clock waveform generation circuitry, the output logic circuitry providing a divided version of the high frequency clock during a normal mode of operation and providing the scan test clock during a test mode of operation.

21. The scan clock circuit of claim 20 wherein the global storage device is a circular shift register and the sequence of state values is a plurality of bits of a first logic value and a single bit of a second, opposite logic value, the plurality of bits being correlated to a ratio of the high frequency operating clock and the first frequency of the reference clock.

22. A scan clock circuit comprising:

a clock generator for receiving a reference clock having a first frequency and providing a high frequency operating clock having a second frequency that is higher than the first frequency;

a global storage device coupled to the clock generator for receiving the high frequency operating clock, the global storage device storing a sequence of state values;

a first local storage device for storing a phase control signal;

clock waveform generation circuitry having a first input coupled to the global storage device for receiving the sequence of state values, a second input coupled to the first local storage device for receiving the phase control signal, a control input for receiving a test control signal, and an output for providing a scan test clock having the first frequency, the scan test clock generating shift and capture cycles having a pulse of predetermined phase and duration when the test control signal is negated and generating a launch cycle of the scan test clock when the test control signal is asserted and having a pulse of differing phase that creates a pulse-to-pulse delay between the launch cycle and an immediately following capture cycle that is equal to a nominal clock period of a predetermined clock domain to permit scan test launching and capturing in a domain-specific at-speed period much shorter than a period of the reference clock; and output logic circuitry coupled to the high frequency operating clock and to the clock waveform generation circuitry, the output logic circuitry providing a divided version of the high frequency clock during a normal mode of operation and providing the scan test clock during a test mode of operation, wherein the output logic circuitry provides first and second complementary clock outputs during the normal mode of operation, and provides a first scan test signal and a second scan test signal that is independent of the first scan test signal during the test mode of operation.

* * * * *